United States Patent
Stearns et al.

(10) Patent No.: US 6,477,046 B1
(45) Date of Patent: *Nov. 5, 2002

(54) BALL GRID ARRAY PACKAGE AND METHOD USING ENHANCED POWER AND GROUND DISTRIBUTION CIRCUITRY

(75) Inventors: William P. Stearns, Richardson, TX (US); Nozar Hassanzadeh, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/596,729

(22) Filed: Jun. 16, 2000

Related U.S. Application Data (63) Continuation of application No. 09/072,710, filed on May 5, 1998.
(60) Provisional application No. 60/046,062, filed on May 9, 1997.

(51) Int. Cl.[7] .................................................. H05K 7/20
(52) U.S. Cl. ..................... 361/704; 361/719; 361/761; 361/764; 361/774; 257/700; 257/712; 257/737; 174/251
(58) Field of Search ................................ 361/690, 692, 361/693, 704–710, 717–719, 749, 772–774, 764; 257/691, 693, 697, 707, 713, 723, 738, 712; 174/254, 252, 16.3

(56) References Cited

U.S. PATENT DOCUMENTS

| | | | | |
|---|---|---|---|---|
| 5,562,971 A | * | 10/1996 | Tsuru et al. | 428/209 |
| 5,724,232 A | * | 3/1998 | Bhatt et al. | 361/762 |
| 5,825,628 A | * | 10/1998 | Garbelli et al. | 361/763 |
| 5,864,470 A | * | 1/1999 | Shim et al. | 361/777 |
| 6,081,426 A | * | 6/2000 | Takeda et al. | 361/704 |
| 6,107,683 A | * | 8/2000 | Castro et al. | 257/700 |

* cited by examiner

Primary Examiner—Lynn D. Feild
Assistant Examiner—Boris Chervinsky
(74) Attorney, Agent, or Firm—W. James Brady; Frederick J. Telecky, Jr.

(57) ABSTRACT

A structure (10) is provided that is fabricated as a ball grid array substrate that includes a substrate dielectric (14), a power ring (18), a ground ring (20), a plurality of traces, and a second metal layer (16). The substrate dielectric (14) includes a first side, a second side, and a cavity formed therein. The power ring (18), the ground ring (20), and the plurality of traces are provided on the first side of the substrate dielectric (14). The plurality of traces, for example, may include a signal connection (22), a ground connection (24), and a power connection (26). The second metal layer (16) is provided on the second side of the substrate dielectric (14) and is electrically coupled to the first side. For example, the second metal layer (16) may serve as an active ground plane and electrically couple to a variety of ground connections, such as the ground connection (24), and the ground ring (20) through vias in the substrate dielectric (14). The present invention also provides a method for forming a ball grid array package using the structure (10).

18 Claims, 5 Drawing Sheets

BALL GRID ARRAY PACKAGE AND METHOD USING ENHANCED POWER AND GROUND DISTRIBUTION CIRCUITRY

This is a continuation of application Ser. No. 09/072,710, filed May 5, 1998, which claims priority under 35 USC §119(e)(1) of provisional application No. 60/046,062, filed May 9, 1997.

TECHNICAL FIELD OF THE INVENTION

This invention relates in general to the field of semiconductor device packaging, and more particularly to a ball grid array package and method using enhanced power and ground distribution circuitry.

BACKGROUND OF THE INVENTION

The use of ball grid arrays (BGAs) to package electronic circuits and devices such as integrated circuit chips is becoming more prevalent. BGA packaging has proven to provide substantial advantages over other packaging techniques such as, for example, dual in-line packages (DIPs), pin grid array (PGA) packages, tape carrier packages (TCPs), and quad flat packs (QFPs). The advantages of BGA packaging become especially significant when used to package an integrated circuit chip or die having a high pin count and when used to package devices employing high frequency signals. BGA packaging provides the additional advantage of being able to use conventional surface mount technologies (SMTs) and assembly techniques when mounting to a printed circuit board (PCB).

A BGA package generally includes a die or chip, one or more substrate layers provided on top of one another and aligned through a cavity portion, an array of solder balls for providing an electrical and mechanical connection external to the BGA package, and a heat spreader/stiffener for providing a thermal conduction path to cool the die and to provide mechanical support and rigidity to the. BGA package. The substrate layers include various metal layers and traces that serve as signal and/or power distribution connections in addition to distinct signal and power planes. Each of the solder balls of the array of solder balls electrically couple to either ground pads, power pads, or signal pads on the exposed substrate. Solder balls may also couple to sacrificial pads that are provided for mechanical advantages and do not provide an electrical connection to the package. The electrical connections are generally made through vias or metallized interconnections provided through the various substrate layers. The fabrication of the various vias and substrate layers is expensive and time consuming and reduces the overall packaging yield and reliability of high pin-count packages.

The die is generally mounted on the heat spreader/stiffener using an adhesive or glue such as an epoxy. The various bond pads of the die are electrically coupled to the various solder balls of the array of solder balls by coupling to either the ground plane, the power plane, or to a corresponding signal trace provided by the signal plane. The connection is generally provided using wire bonding techniques. These connections are expensive and complicated by the fact that connections must be made a with multiple substrate layers.

The fabrication of the multiple metal layers, traces, and multiple substrate layers is expensive. The complexity and cost of BGA packages are also influenced by the number of signal layers and vias that must be provided in the various substrate layers to provide a path to connect the solder balls to either the ground plane, the power plane, or a desired signaling lead of the signal plane. In general, multiple substrate layers and multiple vias result in lower BGA package fabrication yields and higher costs. The formation of the vias create additional complexity and cost because each of the vias generally require the formation of a conductive layer, such as a metal layer on the internal walls of the via, to ensure a complete electrical path. This may be referred to as metallization. The metallization of the internal walls of each. via increases the overall complexity and cost of manufacturing multiple substrate layer BGA packages.

SUMMARY OF THE INVENTION

From the foregoing it may be appreciated that a need has arisen for a ball grid array substrate and method, that uses a single substrate layer having a metal layer on each side thereby eliminating the need to provide multiple substrate layers and associated multiple metal layers while maintaining a high level of electrical performance. In accordance with the present invention, a ball grid array substrate and method are provided which substantially eliminate the disadvantages and problems outlined above.

According to the present invention, a ball grid array substrate is provided that includes a substrate dielectric, a power ring, a ground ring, a plurality of traces, and a metal layer. The substrate dielectric has a first side, a second side, and a cavity formed therein. The power ring, the ground ring, and the plurality of traces are provided on the first side of the dielectric. The metal layer is provided on the second side of the substrate dielectric and is electrically coupled to the first side. In one embodiment, the metal layer serves as the ground plane and electrically couples with the ground ring and select traces of the plurality of traces that serve as ground connections. In another embodiment, the metal layer serves as the power plane and electrically couples with the power ring and the select traces of the plurality of traces,that serve as power connections.

According to another aspect of the present invention, a method for forming a structure, such as a ball grid array substrate and package, is provided. The method includes the step of providing a substrate having a first metal layer on a first side of a substrate dielectric, and a second metal layer on a second side of the substrate dielectric. The method further includes the steps of forming a power ring, a ground ring, and a plurality of traces on the first metal layer. Each of the plurality of traces serving as either a ground connection, a signal connection, or a power connection. Next, the method includes forming a cavity in the substrate. Finally, the method includes the step of forming vias that couple portions of the first metal layer to the second metal layer.

In alternative embodiments, the method for forming a structure of the present invention includes additional steps to form a ball grid array package. In such a case, the method includes the steps of mounting the substrate to a heat spreader/stiffener and mounting a die to the heat spreader/stiffener through the cavity in the substrate. Next, the method includes the step of coupling a die bond pad of the die to the first metal layer, such as a signal die bond pad to a signal trace. Finally, the method includes the step of sealing the die cavity and forming solder balls to attach to the first metal layer.

The present invention provides myriad technical advantages. One technical advantage of the present invention includes the elimination of multiple substrate or substrate dielectric layers. Multiple layers increase the overall complexity and costs of BGA packages while reducing overall yield. Another technical advantage of the present invention includes the minimization of substrate vias, the elimination of signal connection vias, and a novel layout that allows multiple connections, such as ground connections, to be electrically coupled using minimal or shared vias to minimize overall fabrication costs. Yet another technical advantage of the present invention includes enhanced electrical characteristics by providing an active ground plane at a desired distance from a signal plane so that signal line impedance may be controlled as desired. In this manner, overall device performance is enhanced by providing lower lead or trace inductances and capacitances with minimized cross-talk. This is especially important when using BGA packaging with a die or chip operating at a high frequency and having a high pin count or I/O count. Still yet another technical advantage includes a common power ring and a common ground ring that provides a versatile wire bond interconnect to the die as needed. Other technical advantages are readily apparent to one skilled in the art from the following figures, description, and claims.

BRIEF DESCRIPTION OF THE DRAWINGS

For a more complete understanding of the present invention and the advantages thereof, reference is now made to the following brief description, taken in connection with the accompanying drawings and detailed description, wherein like reference numerals represent like parts, in which.

DETAILED DESCRIPTION OF THE INVENTION

Figure 1:
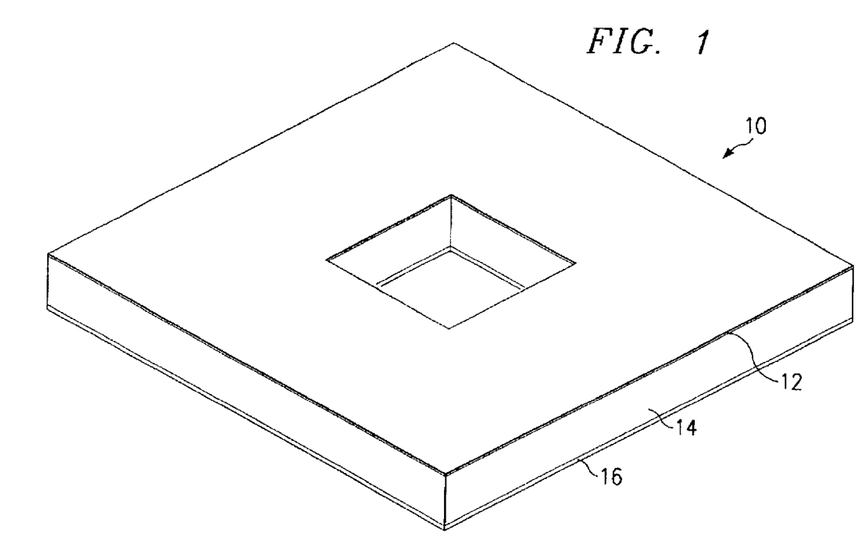
FIGS. 1 through 3 are a series of perspective views illustrating the fabrication of a structure that is first provided as a ball grid array substrate and then as a ball grid array package according to the teachings of the present invention.
Figure 2:
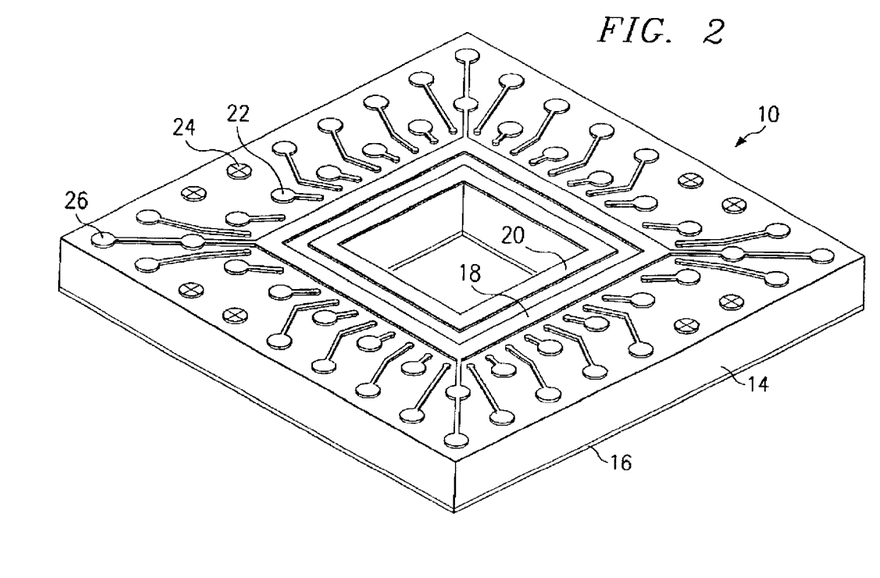
Figure 3:
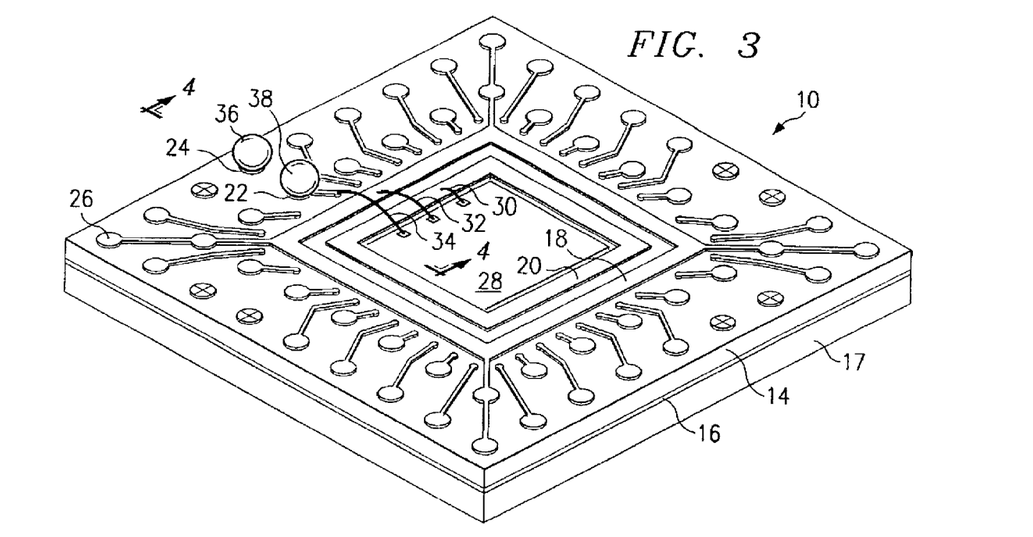

FIGS. 1–3 are a series or prospective views illustrating the fabrication of a structure 10 according to the teachings of the present invention. Structure 10 is first fabricated as a ball grid array substrate and then as a ball grid array package as shown in FIG. 3. It should also be noted that FIGS. 1–3 are not drawn to scale; and that the various components of structure 10 may be provided in various thicknesses.

Structure 10 includes a first metal layer 12 provided on a first side of a substrate dielectric 14, and a second metal layer 16 provided on a second side of substrate dielectric 14 as shown in FIG. 1. A cavity is provided in the center of first metal layer 12, substrate dielectric 14, and second metal layer 16. The cavity may be formed either before or after formation of the circuitry features illustrated in FIG. 2 and discussed below. These elements are aligned such that the cavity or opening in each element is aligned with the cavity or opening in the adjoining element. First metal layer 12 and second metal layer 16 may be provided as virtually any conductive metal layer suitable for attaching to a dielectric layer. Preferably, first metal layer 12 and second metal layer 16 will be provided as a copper layer with nickel and gold plating provided at connections as needed. Substrate dielectric 14 may be fabricated using virtually any, substrate dielectric or insulator material such as a thin film of polyimide or an organic resin based glass fiber reinforced dielectric laminate. First metal layer 12 and second metal layer 16 are attached to substrate dielectric 14 using any available means such as an adhesive or other means typically used with films or rigid printed circuit board substrates.

FIG. 2 illustrates the formation of a power ring 18, a ground ring 20, and a plurality of traces using first metal layer 12 of structure 10. In the one embodiment illustrated in FIG. 2, ground ring 20 is shown surrounding the cavity in structure 10 and power ring 18 is provided in a square or rectangular configuration with each corner extending diagonally outward. In this embodiment, power ring 18 extends all the way around ground ring 20 and couples with various traces or power connections at the diagonal extensions. Power ring 18 serves as the power plane of the ball grid array substrate in the embodiment shown in FIG. 2.

The plurality of traces provided on the first side of substrate dielectric 14 include ground connections, power connections, and signal connections. The ground connections are designated with an "X" provided in their center. For example, a ground connection 24 is illustrated in FIG. 2. The signal connections may include a circular bond portion and a trace or extension portion that extends towards the cavity. The portion that extends towards the cavity will ultimately be used to wire bond each individual signal connection to a corresponding signal die bond pad of a chip or die. For example, a signal connection 22 is provided in FIG. 2. Finally, various power connections, such as power connection 26, are provided in the ball grid array substrate of structure 10. The power connections couple with power ring 18 and may be provided, in one embodiment, as part of the diagonal extensions provided at each corner of power ring 18.

Ground ring 20 electrically couples with second metal layer 16 which serves as an active ground plane of the ball grid array substrate. This may be accomplished using any available means such as those illustrated in FIGS. 4 and 5 which are discussed more fully below.

The formation of power ring 18, ground ring 20, and the plurality of traces may be accomplished using any known and available technique readily available to one of ordinary skill in the art. For example, first metal layer 12 may be selectively exposed and etched using various techniques, such as chemical etching techniques, to create the various traces and configurations illustrated in FIG. 2. It should also be noted at this point that the configuration of power ring 18, ground ring 20, and the plurality of traces provided on the first side of substrate dielectric 14 may be provided in virtually any convenient or advantageous configuration. In alternative embodiments, power ring 18 and ground ring 20 may be exchanged such that power ring 18 is within ground ring 20. In such a case, power ring 18 would couple with second metal layer 16 which would then serve as the power plane of the ball grid array substrate.

Figure 9:
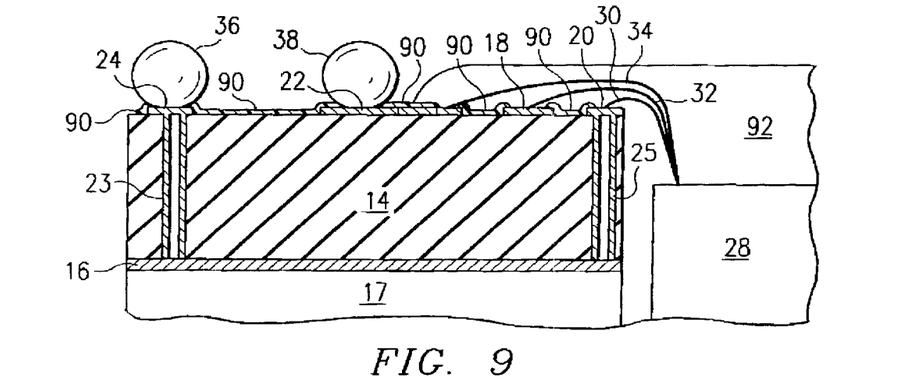
FIG. 9 is a sectional view of the ball grid array package similar to FIG. 4 with the addition of a solder mask layer and an encapsulant.

A solder mask layer, not shown in FIG. 2, is typically provided over the surface of first metal layer 12 with openings at connections where solder balls will ultimately attach such as 22, 24, 26, etc. The solder mask layer will also include a large enough opening around the die cavity to allow a die to be wire bonded to power ring 18, ground ring 20, and the signal traces of structure 10. The presence of the solder mask layer opening around the die cavity also allows the die and the wire bond connections to be sealed or encapsulated to further protect the package. An example of a solder mask layer 90 is illustrated in FIG. 9.

Referring now to FIG. 3, structure 10 is fabricated as a ball grid array package that includes a die 28 that is attached to a heat spreader/stiffener 17 through the cavity in the ball grid array substrate using an adhesive such as an epoxy. Die 28 is electrically coupled to power ring 18, ground ring 20, and signal connection 22 through wire bonds. A wire bond 30 couples a ground die bond pad of die 28 to ground ring 20. A wire bond 32 couples a power die bond pad of die 28 to power ring 18. Next, a wire bond 34 couples a signal die bond pad of die 28 to signal connection 22. These three wire bond connections are provided as illustrations of each of the three types of connections from die 28 to the ball grid array substrate.

The ball grid array substrate is also shown mounted on heat spreader/stiffener 17 to provide heat dissipation from die 28 and to provide mechanical rigidity to the ball grid array package. After all of the various die bond pads are coupled to either power ring 18, ground ring 20, or a corresponding signal connection, die 28 is sealed or encapsulated within the cavity. This is not shown in FIG. 3.

A solder ball will ultimately be provided at most of the plurality of traces such that a grid of solder balls will be formed. The solder balls are typically composed of eutectic Sn63/Pb37 or similar compositions. However, it should be understood that the present invention is not limited to any particular composition or type of solder ball. Two such solder balls are illustrated in FIG. 3. A solder ball 36 is shown attached to ground connection 24 and a solder ball 38 is shown attached to signal connection 22. Solder ball 36 attaches to ground connection 24 which is electrically coupled through an internal via or interconnect to second metal layer 16 through substrate dielectric 14. Once again, second metal layer 16 serves as an active ground plane of the ball grid array package to enhance the overall electrical characteristics of the ball grid array package. Generally, the via will be provided as a metallized via so that an electrical connection or coupling is provided from solder ball 36, through ground connection 24, to second metal layer 16 which serves as an active ground plane in the one embodiment illustrated in FIGS. 1–3. In this manner, an electrical connection is made between the ground die pad connected to ground ring 20 through wire bond 30 and solder ball 36. This is illustrated more fully in FIGS. 4–5.

Solder ball 38 is shown attached to signal connection 22 and is used to provide an external electrical connection with the signal die bond pad coupled to signal connection 22 through wire bond 34. In this same manner, each signal die bond pad of die 28 may couple to a corresponding signal connection using a wire bond and an external connection from the ball grid array package is then provided using an attached solder ball. Although not illustrated in FIG. 3, a solder ball will be provided at power connection 26 so that an electrical connection will be provided to a corresponding die bond pad of die 28 such as the power die bond pad coupled to power ring 18 through wire bond 32. Ultimately, many of the traces will include a solder ball so that an array of solder balls will be formed to provide an external electrical connection for each of the various die bond pads of die 28. Some traces will include a solder ball but will not be electrically coupled to die 28. These solder balls are provided for mechanical support.

Figure 4:
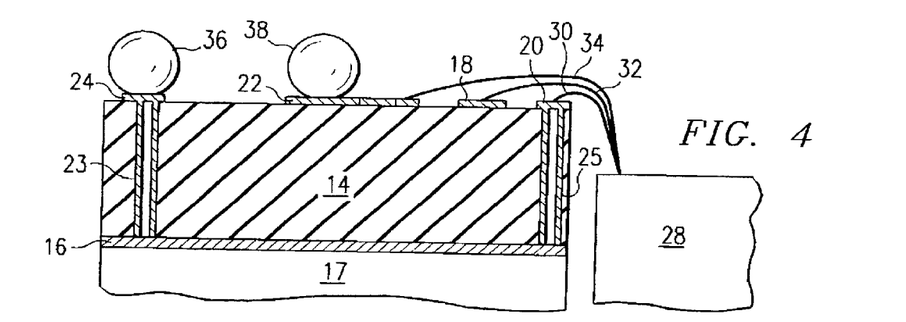
FIG. 4 is a sectional view of the ball grid array package taken along line 4—4 of FIG. 3 illustrating the coupling of a ground ring to a second metal layer.

FIG. 4 is a sectional view of the ball grid array package taken along line 4—4 of FIG. 3, illustrating the coupling of ground ring 20 to second metal layer 16. The via 25 coupling ground ring 20 to second metal layer 16 and the via 23 coupling solder ball 36 and ground connection 24 to second metal layer 16 completes an electrical connection from solder ball 36 to a corresponding ground die bond pad of die 28 coupled to ground ring 20 through wire bond 30. Each of the vias are provided as metallized interconnections such that the internal walls include a metal to form an electrical connection from the first side of substrate dielectric 14 to second metal layer 16. The thickness of substrate dielectric 14 may be provided at any desired thickness to control or affect the electrical characteristics, such as impedance, of the ball grid array package. Second metal layer 16 serves as an active ground plane and the distance between second metal layer 16 and the various signal lines or traces provided on the first side of substrate dielectric 14 are influenced by this critical distance.

Figure 5:
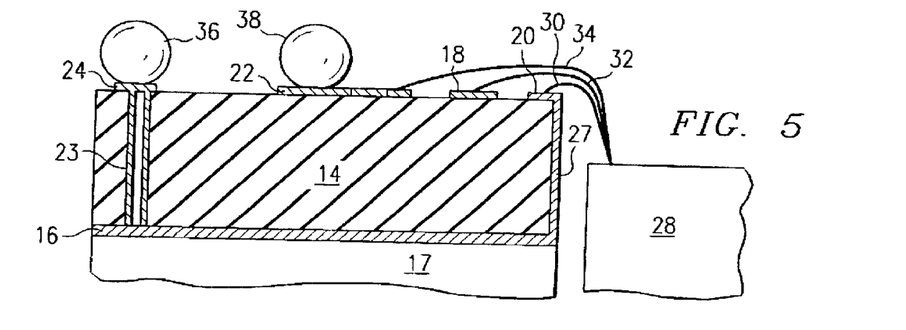
FIG. 5 is a sectional view of the ball grid array package illustrating an alternative design for coupling the ground ring to the second metal layer.

FIG. 5 is a sectional view of the ball grid array package illustrating an alternative design for coupling ground ring 20 to second metal layer 16. In this embodiment, the internal walls of the cavity of substrate dielectric 14 may be metallized entirely or may include a metal or conductive path 27 from ground ring 20 to the second metal layer 16. In this manner, vias do not have to be formed, as was illustrated in FIG. 4, to interconnect ground ring 20 to second metal layer 16. This may further reduce overall fabrication costs. It should also be mentioned that FIGS. 3, 4, and 5 are not drawn to scale and the various components of structure 10 such as heat spreader/stiffener 17, substrate dielectric 14, and die 28 may be provided in a variety of different thicknesses. Also, heat spreader/stiffener 17 may contain a recess or cavity coincident with the cavity provided in the center of first metal layer 12, substrate dielectric 14, and second metal layer 16 so that the top surface of die 28 will be below first metal layer 12 of structure 10. Alternatively, heat spreader/stiffener 17 may comprise two parts. A first part or layer with a cavity through it, and a second part or layer attached beneath the first part or layer. The second part or layer may support die 28 through the cavity of the first part or layer.

Figure 6:
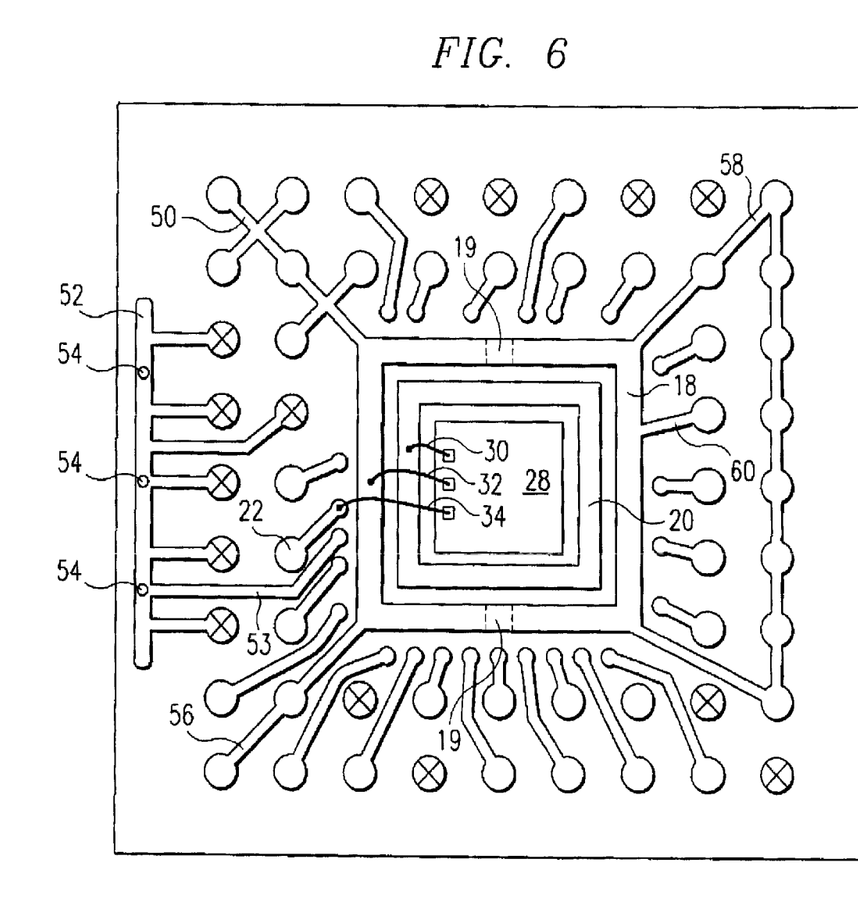
FIG. 6 is a top view illustrating an exemplary configuration of a power ring, a ground ring, and a plurality of traces of the ball grid array package.

FIG. 6 is a top view illustrating an exemplary configuration of power ring 18, ground ring 20, and the plurality of traces of the ball grid array package. It should be mentioned at the outset that this is only an exemplary configuration to illustrate some of the multitude of possible different configurations of power ring 18, ground ring 20, and the plurality of traces that may be implemented using the present invention.

The ball grid array package illustrated in FIG. 6 includes die 28 mounted within the cavity of the ball grid array substrate of structure 10 and mounted on heat spreader/stiffener 17. Die 28 is shown coupled, using exemplary die bond pads, to ground ring 20 using wire bond 30, power ring 18 using wire bond 32, and signal connection 22 using wire bond 34. In this embodiment, ground ring 20 is provided in an enclosed rectangular configuration. Power ring 18 includes a main enclosed rectangular configuration surrounding ground ring 20 and includes various branches or extensions that are provided from this main rectangular configuration. In alternative embodiments, power ring 18 may be provided in segments. This may be illustrated by the two interruptions in power ring 18 shown with dashed lines and reference numeral 19 in FIG. 6. Power ring 18 may also include a second enclosed configuration 58 shown to the right of the main enclosed rectangular configuration. Second enclosed configuration 58 is provided to align with various power connections that will have an attached solder ball and will serve as external electrical power connections to the ball grid array package. Although power ring 18 is illustrated in the embodiment of FIG. 6 as including an enclosed main ring surrounding ground ring 20, in other embodiments of the present invention, power ring 18 may be split into segments as dictated by the electrical needs and the layout of die 28. In this manner, a segment of power ring 18, may be located adjacent to where power die bond pads will be positioned on die 28.

In another embodiment, an extension 50 is shown extending diagonally from the upper left portion of the main enclosed rectangular portion of power ring 18. As illustrated, extension 50 provides various power connections located directly on extension 50 and may provide additional branches extending from either side of extension 50 to electrically couple with additional power connections in the package. An extension 56 is also illustrated extending diagonally from the lower left portion of the enclosed rectangular portion of power ring 18. Extension 56 provides an electrical path to couple the various power connections provided at the end of extension 56 to power ring 18. Power ring 18 may also include an extension 60 that provides a convenient trace to serve as a power connection for the package. As mentioned, each of the various signal connections, ground connections and power connections illustrated in FIG. 6 will ultimately have a solder ball attached which will together serve as the external ball grid array that is used to provide an external electrical connection to the ball grid array package.

For illustrative purposes, each of the ground connections of the ball grid array package shown in FIG. 6 are designated with an "X". It should be understood that the ground connection layout and other connection layouts illustrated in FIG. 6 are but one embodiment of the present invention. As such, other packages may have any different number and placement of ground connections, power connections, or signal connections. Each of the ground connections of FIG. 6 form an electrical connection with second metal layer 16, as was illustrated in FIGS. 4 and 5. Second metal layer 16, in this embodiment, serves as the active ground plane of the ball grid array package. Generally, the individual ground connections that are not electrically coupled to other ground connections include a metallized via that extends from the first side of substrate dielectric 14 to the second side of substrate dielectric 14 to provide an electrical connection with second metal layer 16. However, other configurations are possible. For example, an extension 52 is shown that includes three vias 54 which couple to individual ground connections. In this manner, each of the ground connections do not have to have a dedicated via to provide the electrical connection to second metal layer 16. Thus, with reference to extension 52, instead of providing six individual vias for each of the six ground connections, only three vias must be provided. This results in substantial fabrication savings. Extension 52 also includes a finger trace that extends towards die 28 and between two adjacent signal traces. This configuration provides substantial advantages by providing signal isolation between adjacent signal traces because of the presence of the finger ground trace between the adjacent signal traces. Thus, the ball grid array package of FIG. 6 illustrates some of the multitude of possible configurations of power ring 18, ground ring 20, and the plurality of traces that may be provided in the present invention.

Figure 7:
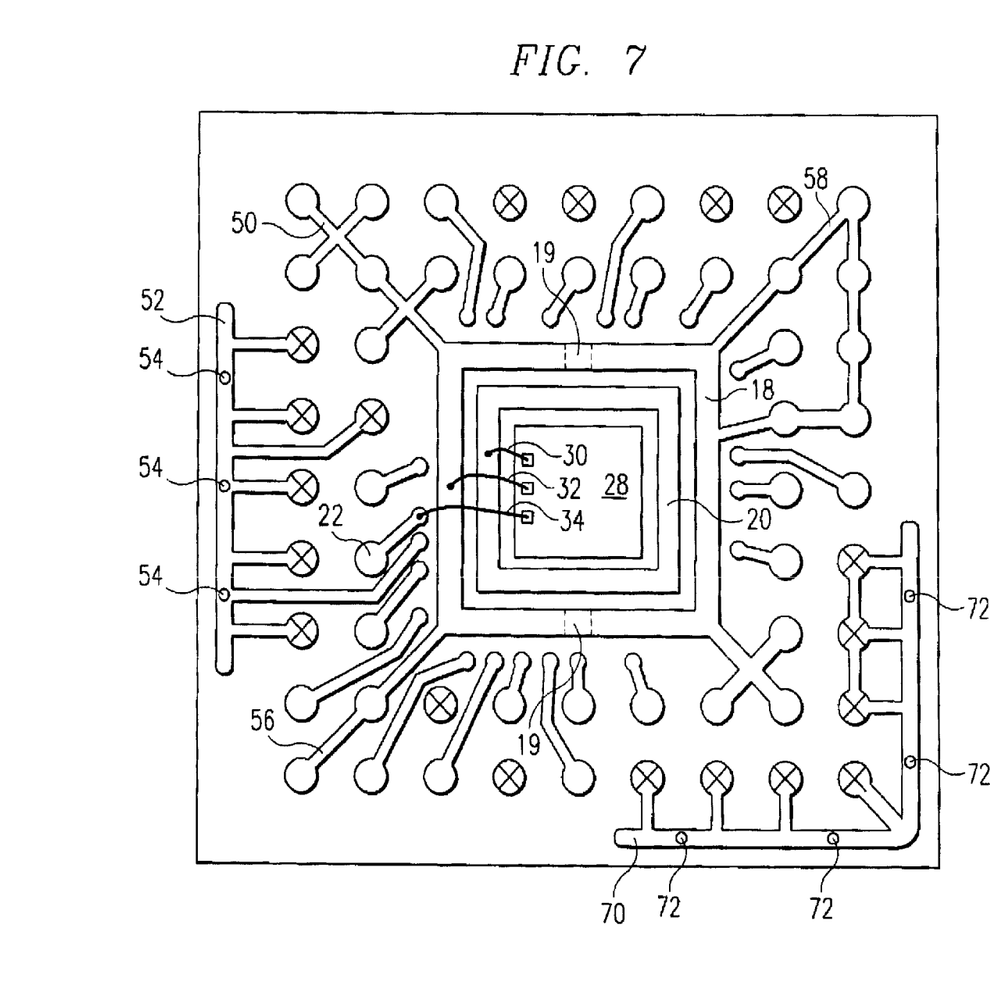
FIG. 7 is a top view illustrating another exemplary configuration of a power ring, a ground ring, and a plurality of traces of the ball grid array package.

FIG. 7 is a top view illustrating another exemplary .configuration of power ring 18, ground ring 20, and the plurality of traces of the ball grid array package. FIG. 7 is similar to FIG. 6 except for the changes shown in the lower right hand portion of the ball grid array package. A corner trace or corner extension 70 is shown to illustrate an advantageous configuration to group or electrically couple various ground connections. Corner extension 70 is similar to extension 52 discussed above. Corner extension 70 is shown electrically coupling seven ground connections while requiring only four vias 72 to provide an electrical connection with the underlying active ground plane provided by second metal layer 16. This type of arrangement allows for ground connections to be conveniently located in hard to reach corners of ball grid array packages. This greatly simplifies overall trace layout design and ensures that substrate and package "real estate" or area is not wasted.

Figure 8:
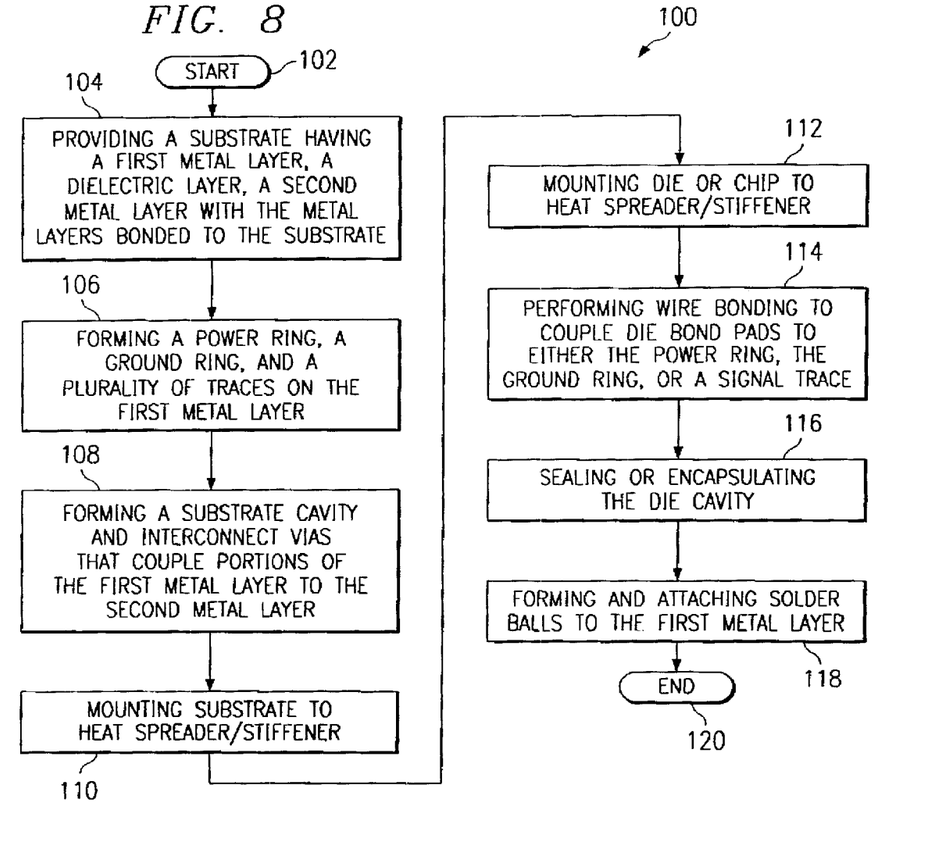
FIG. 8. is a flowchart illustrating an exemplary method for forming a ball grid array substrate and a ball grid array package according to the teachings of the present invention.

FIG. 8 is a flow chart illustrating an exemplary method 100 for forming a ball grid array substrate and a ball grid array package according to the teachings of the present invention. Method 100 begins at step 102 and proceeds to step 104 where a substrate having a first metal layer, a substrate dielectric layer, and a second metal layer with the metal layers bonded to the substrate dielectric layer is provided. At step 106, a power ring, a ground ring, and a plurality of traces are formed on the first metal layer of the substrate. The plurality of traces may serve as signal connections, ground connections, and power connections.

At step 108, a substrate cavity and interconnect vias are formed to complete the formation or fabrication. of a ball grid array substrate. The interconnect vias couple portions of the first metal layer of the substrate to the second metal layer. It should be understood that the substrate cavity could be preformed or provided as part of the substrate in step 104. In one embodiment, the vias are provided as metallized interconnects that couple the various ground connections formed in step 106 using the first metal layer to the second metal layer which serves as an active ground plane. This may include extensions, such as extension 52 of FIG. 6 and corner extension 170 of FIG. 7, which may include various ground connections. In other embodiments, the second metal layer may serve as a power plane and thus the metallized vias may be used to provide electrical connections between the various power connections formed on the first metal layer in step 106 to the second metal layer which serves as the power plane.

Once again, it should be mentioned that a solder mask layer may be provided over the surface of the first metal layer with openings at the connections or pads of the traces where solder balls will ultimately attach. The solder mask layer will also include a sufficiently large enough opening around the substrate cavity to allow a die to be wire bonded to the power ring, the ground ring, and the signal traces of the plurality of traces. The presence of the solder mask layer opening around the die cavity also allows the die and the wire bond connections to be sealed or encapsulated to further protect the package. An example of a solder mask is illustrated in FIG. 9. In alternative embodiments of the ball grid array substrate, solder balls may be attached at this point to provide both electrical and mechanical external connections to the ball grid array substrate.

At step 110, the substrate is mounted to a heat spreader/stiffener. This may be accomplished using any available adhesive such as a thermal epoxy. At step 112, a die or chip is mounted to the heat spreader/stiffener within the cavity of the substrate. The die is attached to the heat spreader/stiffener using any available or conventional die attach adhesive such as a thermal epoxy.

It should be noted about the two previous steps that the heat spreader/stiffener may be provided as one layer or two separate layers. If the heat spreader/stiffener is provided as two separate layers, the first layer may be referred to as the stiffener which is bonded between the substrate and the second layer which may be referred to as the heat spreader. In such a case, the stiffener may or may not electrically couple to the heat spreader, depending on the bond between the stiffener and the heat spreader and the electrical conductivity of the heat spreader. Furthermore, the stiffener layer may have a recess or cavity formed in it so that the die is directly attached to the heat spreader through the cavity in the stiffener.

Proceeding next to step 114, the various die, bond pads, that are provided as either a power die bond pad, a ground die bond pad, or a signal die bond pad, are electrically coupled to either the power ring, the ground ring, or a signal trace formed using the first metal layer of the substrate. In a preferred embodiment, this may be accomplished by performing wire bonding to couple each of the individual die bond pads to a corresponding connection. At step 116, the die cavity is sealed or encapsulated so that the various electrical connections are held in place and to protect the die or chip and wire bond connections from external elements.

Finally, at step 118 the solder balls are attached to the various connections formed in the first metal layer. Generally, the solder balls will form a rectangular array of solder balls provided around periphery of the ball grid array package. Once again, some of the solder balls will provide external electrical connections to the semiconductor or ball grid array package while other solder balls are attached to sacrificial pads and provide external mechanical support to the package. Method 100 ends at step 120.

FIG. 9 is a sectional view of the ball grid array package similar to FIG. 4 with the addition of a solder mask layer 90. Solder mask layer 90 provides openings at connections where solder balls will ultimately attach such as signal connection 22 and ground connection 24 as illustrated. Solder mask layer 90 will also include an opening sufficiently large around the die cavity to allow die 28 to be wire bonded to power ring 18, ground ring 20, and the various signal traces. After the various connections have been made, die 28 and the wire bond connections, such as wire bonds 30, 32, and 34, are typically sealed or encapsulated to further protect the semiconductor package. An encapsulant 92 is shown surrounding die 28 and the various bond wires. Solder mask layer 90 is typically applied using conventional solder mask application techniques and conventional solder mask materials. For example, solder mask layer 90 may be an epoxy or acrylic solder mask material applied using conventional solder mask patterning and application techniques.

Thus, it is apparent that there has been provided, in accordance with the present invention, a ball grid array package and method using enhanced power and ground distribution circuitry that satisfy the advantages set forth above. Although the preferred embodiment has been described in detail, it should be understood that various and numerous changes, substitutions, and alterations can be made herein without departing from the scope of the present invention. For example, although the present invention has been described and illustrated with second metal layer 16 serving as an active ground plane, the present invention also encompasses the use of second metal layer 16 serving as a power plane. Also, the configuration of power ring 18, ground ring 20, and the plurality of traces can be provided in virtually any convention or advantageous configuration without departing from the present invention. In fact, it should be understood that in this description and invention, the term "ring," such as it is used with power ring 18 and ground ring 20, is defined to include not only circular shapes and other configurations that define an enclosed area, but virtually any shape known, whether that shape defines a completely enclosed area or not. Furthermore, the direct connections illustrated herein could be altered by one skilled in the art such that two components or elements are merely coupled to one another through an intermediate device or devices, without being directly connected, while still achieving the desired results demonstrated by the present invention. For example, variations could include multiple bond wires bonded to a single trace and solder ball combination, multiple solder balls could be used on a single trace, and multiple traces could be routed to a single solder ball. Other examples of changes, substitutions, and alterations are readily ascertainable by one skilled in the art and could be made without departing from the spirit and scope of the present invention as defined by the following claims.

What is claimed is:

1. A ball grid array substrate comprising:
   a substrate dielectric having a first side and a second side;
   a plurality of ground connections provided on the first side;
   a plurality of signal traces provided on the first side, each of said signal traces having a length;
   a solid, contiguous metal layer provided on the second side of the substrate dielectric, the metal layer electrically coupled to the plurality of ground connections to provide a continuous electrical return path on the second side of the substrate dielectric substantially under the entire length of each of said plurality of signal traces.

2. The ball grid array substrate of claim 1, further comprising a ground trace provided on the first side of the substrate between a pair of said signal traces, said ground trace electrically coupled to the solid, contiguous metal layer to provide signal isolation between said pair of said signal traces.

3. The ball grid array substrate of claim 1, further comprising a plurality of ground traces electrically coupled to one another on the first side, the plurality of ground traces electrically coupled to the metal layer on the second side through a metalized via.

4. The ball grid substrate of claim 1, further comprising a power ring on the first side, wherein the power ring includes extension branches.

5. The ball grid substrate of claim 1, further comprising a power ring on the first side, wherein the power ring includes segments.

6. The ball grid array substrate of claim 1, further comprising:
   an array of solder balls provided on the first side of the substrate dielectric, the array of solder balls coupled to the plurality of signal traces and ground connections to provide an external connection to the ball grid array substrate.

7. The ball grid array substrate of claim 1, further comprising a cavity formed therein for receiving a die.

8. The ball grid array substrate of claim 7, wherein one of said plurality of ground connections comprises a ground ring, said ground ring adjacent said cavity.

9. A semiconductor package comprising:
a ball grid array substrate having a plurality of signal traces, each of said signal traces having a length, a plurality of ground connections, and an array of solder balls on a first side of a substrate dielectric, the array of solder balls coupled to the plurality of signal traces and the plurality of ground connections to provide an external connection to the semiconductor package, the ball grid array substrate having a solid, contiguous metal layer on a second side of the substrate dielectric that is electrically coupled to the plurality of ground connections to provide a continuous electrical return path on the second side of the substrate dielectric substantially under the entire length of each of said plurality of signal traces; and
a die mounted adjacent the ball grid array substrate, the die having at least one signal pad coupled to one of said plurality of signal traces, and at least one ground pad coupled to at east one of the plurality of ground connections.

10. The semiconductor package of claim 9, further comprising a stiffener attached to said metal layer, said ball grid array substrate having a cavity, said die mounted on said stiffener within said cavity.

11. The semiconductor package of claim 9, further comprising a cavity formed within said ball grid array substrate, said die mounted within said cavity.

12. The semiconductor package of claim 9, wherein the metal layer serves as a ground plane.

13. The semiconductor package of claim 12, further comprising a ground trace provided on the first side of the substrate between a pair of said signal traces, said ground trace electrically coupled to the solid, contiguous metal layer to provide signal isolation between said pair of signal traces.

14. The semiconductor package of claim 9, wherein said at least one signal pad is coupled to one of said plurality of signal traces by a wire bond.

15. The semi semiconductor package of claim 9, wherein said at least one ground pad is coupled to one of said plurality of ground connections by a wire bond.

16. The semiconductor package of claim 11, wherein one of said plurality of ground connections comprises a ground ring, said ground ring adjacent said cavity.

17. The semiconductor package of claim 16, wherein the metal layer serves as a ground plane and is electrically coupled to the ground ring through a metallized via.

18. The semiconductor package of claim 16, wherein the metal layer serves as a ground plane and is electrically coupled to the ground ring through the cavity.

* * * * *